United States Patent
Hofmann et al.

(10) Patent No.: US 6,998,672 B2
(45) Date of Patent: Feb. 14, 2006

(54) MEMORY CELL

(75) Inventors: Franz Hofmann, Munich (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 58 days.

(21) Appl. No.: 10/779,557

(22) Filed: Feb. 6, 2004

(65) Prior Publication Data
US 2004/0183125 A1  Sep. 23, 2004

Related U.S. Application Data

(63) Continuation of application No. PCT/DE02/02759, filed on Jul. 26, 2002.

(30) Foreign Application Priority Data
Aug. 6, 2001  (DE) ............... 101 38 585

(51) Int. Cl.
  *H01L 29/788*  (2006.01)
(52) U.S. Cl. ............ 257/316; 257/319; 257/320; 257/335; 257/336; 257/337; 257/338; 257/339; 257/340; 257/341; 257/342; 257/343
(58) Field of Classification Search ........ 257/318–322, 257/335–343, 316
  See application file for complete search history.

(56) References Cited

U.S. PATENT DOCUMENTS

| | | | |
|---|---|---|---|
| 4,907,197 A * | 3/1990 | Uchida | 365/185.14 |
| 5,270,559 A * | 12/1993 | Yariv et al. | 257/249 |
| 5,284,784 A * | 2/1994 | Manley | 438/263 |
| 5,350,937 A * | 9/1994 | Yamazaki et al. | 257/316 |
| 5,633,519 A * | 5/1997 | Yamazaki et al. | 257/315 |
| 5,900,657 A * | 5/1999 | Merrill | 257/296 |

(Continued)

FOREIGN PATENT DOCUMENTS

DE  100 36 911 A1  2/2002

(Continued)

OTHER PUBLICATIONS

Hayashi Y et al.: "Twin Monos Cell With Dual Control Gates"; 2000 Symposium on VLSI TECHNOLOGY, Digest of Technical Papers, Honolulu, HI, Jun. 13-15, 2000, Symposium on VLSI Technology, New York, NY; IEEE, US, Jun. 13, 2000, pp. 122-123, XP000970787.

(Continued)

*Primary Examiner*—Amir Zarabian
*Assistant Examiner*—Ida M. Soward
(74) *Attorney, Agent, or Firm*—Darby & Darby

(57) ABSTRACT

A memory cell having a source region, a drain region, a source-end control gate, a drain-end control gate, an injection gate arranged between the source-end control gate and the drain-end control gate, a source-end storage element arranged in the source-end control gate, and a drain-end storage element arranged in the drain-end control gate. To program the memory cell, a low electrical voltage is applied to the injection gate, and a high electrical voltage is applied to the control gates.

10 Claims, 4 Drawing Sheets

U.S. PATENT DOCUMENTS

| | | | | |
|---|---|---|---|---|
| 5,973,357 | A | * 10/1999 | Uenoyama et al. | 257/321 |
| 5,977,585 | A | * 11/1999 | Vasche | 257/321 |
| 5,991,204 | A | * 11/1999 | Chang | 365/185.29 |
| 6,043,530 | A | * 3/2000 | Chang | 257/320 |
| 6,057,575 | A | * 5/2000 | Jenq | 257/319 |
| 6,091,101 | A | * 7/2000 | Wang | 257/315 |
| 6,093,945 | A | * 7/2000 | Yang | 257/317 |
| 6,107,139 | A | * 8/2000 | Tu et al. | 438/254 |
| 6,107,141 | A | * 8/2000 | Hsu et al. | 438/267 |
| 6,228,695 | B1 | * 5/2001 | Hsieh et al. | 438/201 |
| 6,281,545 | B1 | * 8/2001 | Liang et al. | 257/315 |
| 6,291,855 | B1 | * 9/2001 | Chang et al. | 257/316 |
| 6,313,500 | B1 | * 11/2001 | Kelley et al. | 257/316 |
| 6,331,721 | B1 | * 12/2001 | Sung et al. | 257/317 |
| 6,335,554 | B1 | 1/2002 | Yoshikawa | |
| 6,388,293 | B1 | 5/2002 | Ogura et al. | |
| 6,504,207 | B1 | * 1/2003 | Chen et al. | 257/319 |

FOREIGN PATENT DOCUMENTS

| | | |
|---|---|---|
| JP | 2001 156188 A1 | 6/2001 |

OTHER PUBLICATIONS

Patent Abstracts of Japan, vol. 2000, No. 22, Mar. 9, 2001 & JP 2001 148434 A (New Heiro: KK; Halo LSI Design & Device Technol Inc), May 29, 2001, abstract.

Naruke K et al. "A New Flash-Erase EEPROM Cell with a Sidewall Select-Gate on its Source Side"; Tech. Digest, 1989, IEDM 89-603, pp. 25.7.1-25.7.4.

* cited by examiner

MEMORY CELL

CROSS-REFERENCE TO RELATED APPLICATION

This application is a continuation of International Patent Application Serial No. PCT/DE02/02759, filed Jul. 26, 2002, which published in German on Feb. 27, 2003 as WO 03/017374 A2, and is incorporated herein by reference in its entirety.

FIELD OF THE INVENTION

The invention relates to a memory cell.

BACKGROUND OF THE INVENTION

Computers with memory arrays are used in a wide variety of applications including mainframe computers, personal computers, washing machines, kitchen appliances, motor vehicles, telephones, answering machines and other applications. A computer is to be understood here in the widest sense as an electronic control device and/or computing device.

The memory arrangement of a computer is used for permanently or temporarily storing data, for example parameters which are necessary for operating the computer, or computing results which are generated by the computer when the computer is operating.

The memory arrangement has a memory with at least one memory cell, generally a plurality of memory cells. Each memory cell has a storage element in which a quantity of electrical charge can be stored in order to set the memory contents of the memory cell.

There are volatile and non-volatile memory cells. In a volatile memory cell, a memory content which is stored in the storage element typically remains for only approximately a second in the storage element. The memory contents must therefore be periodically refreshed. In a non-volatile memory cell, the memory contents which are stored in the storage element remain permanently in the storage element for a storage time of the order of magnitude of years.

A non-volatile MOSFET-based memory cell (MOSFET=metal oxide semiconductor field effect transistor) is based on a MOSFET with a source region, a drain region, a channel region running between the source region and the drain region, a gate electrode (control gate) which is arranged in order to control the channel region, and a gate oxide layer which is arranged between the gate electrode (control gate) and the channel region.

In the non-volatile MOSFET-based memory cell, the gate electrode is used as a control gate. A storage element for storing memory contents of the memory cell is provided between the control gate and the gate oxide layer over the channel region. The storage element has a potential barrier both with respect to the channel region and with respect to the control gate. As a result of the fact that a suitable electrical voltage which is sufficiently high in terms of absolute value is applied to the control gate, electrical charge carriers can be charged from the channel region into the storage element, or can be discharged from the storage element into the channel region. As a result, memory contents of the memory cell can either be programmed or erased.

An example of a non-volatile memory is the EEPROM (Electrically Erasable Programmable Read Only Memory). In an EEPROM, programmed memory contents can be erased again by applying an electrical voltage.

Non-volatile MOSFET-based memory cells are, in terms of design, floating gate memory cells and MIOS memory cells (MIOS=metal insulator oxide semiconductor).

In a floating gate memory cell the storage element is formed by a metallically conductive floating gate.

In a MIOS memory cell, the storage element is formed from an insulator storage element made of (at least) one insulator material. The memory contents of the storage element are formed by a quantity of charge of electrical charge carriers which are trapped in the insulator storage element.

In order to program a MOSFET-based memory cell it is necessary to maintain an electrical current in the channel region of the MOSFET.

To be able to use and operate a memory cell efficiently, efforts are made to reduce the power consumption when the memory cell is programmed.

K. Naruke, S. Yamada, E. Obi, S. Taguchi and M. Wada, "A new flash-erase EEPROM cell with a sidewall select-gate on its source side", Tech. Digest, 1989, IEDM, pp. 25.7.1–25.7.4 discloses a floating gate memory cell. The memory cell from K. Naruke et al. has a source region, a drain region, a channel region, a storage element array with a floating gate and a control gate arranged over it as well as a source-end lateral select gate provided next to the storage element array. In order to program the memory cell from K. Naruke et al., a comparatively low voltage is applied to the select gate to generate a small electrical flow of current in the channel region. An electrical voltage is applied to the control gate, said electrical voltage being sufficiently high to charge electrical charge carriers into the floating gate. In the memory cell from K. Naruke et al., the electrical voltage applied to the select gate can be significantly lower than the voltage which is necessary to charge the floating gate. As a result, it is possible to program with a lower current than in a floating gate memory cell without a select gate. The voltage for the select gate must, on the other hand, be selected to be sufficiently large here for electrical charge carriers to be able to pass from the source region into the channel region so that a continuous electrically conductive channel is formed between the source region and the drain region.

On the other hand, in order to increase the efficiency of the memory cell or of an array of memory cells, attempts are made to achieve the highest possible integration density, i.e., to accommodate as much individual memory content items per unit area or per unit volume.

For this purpose, the structure size of each individual memory cell is typically reduced.

U.S. Pat. No. 6,335,554 B1 discloses a non-volatile semiconductor memory in which a first gate region section which is arranged above a first ONO storage layer and above a source region, a second gate region section which is arranged above a second ONO storage layer and above a drain region, and a third gate region section which is arranged above a channel region and above a gate-insulating layer are provided, the first, second and third gate region sections being electrically connected to one another.

In addition, DE 10036911 A1 (application date: 28 Jul. 2000, date laid-open: 14 Feb. 2002) proposes a memory cell with two ONO storage layers, one of which adjoins a source region and the other a drain region. The conductivity of a channel region is controlled by means of a gate region which is arranged over it as well as by means of two lateral gate components which are connected to the gate region via a connecting line, a gate-insulating layer being arranged between the channel region and the gate region.

SUMMARY OF THE INVENTION

The invention is based on the problem of providing an efficient and reliable memory cell which is economical in terms of current.

The problem is solved by means of a memory cell having the features according to the independent patent claim.

A memory cell is provided which has:

a substrate, a source region formed in the substrate, a drain region formed in the substrate, a channel region provided between the source region and the drain region and having a variable electrical conductivity, a source-end control gate extending at least partially over a source-end edge section, which adjoins the source region, and being designed to change the electrical conductivity of the source-end edge section, a drain-end control gate extending at least partially over a drain-end edge section, which adjoins the drain region, and being designed to change the electrical conductivity of the drain-end edge section, an injection gate arranged between the source-end control gate and the drain-end control gate and extending over a central section of the channel region, the injection gate being electrically isolated from the drain-end control gate and designed to change the electrical conductivity of the central section, which extends between the source-end edge section and the drain-end edge section of the channel region, a source-end storage element extending at least between the source-end edge section and the source-end control gate, a drain-end storage element extending at least between the drain-end edge section and the drain-end control gate, and a gate oxide arrangement having at least one gate oxide layer extending between the substrate on the one side and the source-end control gate, the drain-end control gate and the injection gate on the other side, wherein the source-end control gate and the drain-end control gate are electrically connected to one another.

It is possible to store separate memory contents, and thus one bit of data, in the source-end storage element and in the drain-end storage element respectively. In this way, the storage capacity in the memory cell is doubled in comparison to that of a memory cell with only one storage element.

The memory cell can also be programmed reliably in a way which is economical in terms of current.

The memory cell is programmed according to the following method.

An (electrical) source voltage with a source voltage value is applied to the source region. An (electrical) drain voltage with a drain voltage value is applied to the drain region. The source voltage value and the drain voltage value here are different. Between the source region and the drain region there is a source drain voltage whose value is equal to the difference between the source voltage value and the drain voltage value.

An electrical injection gate voltage with an injection gate voltage value is applied to the injection gate. An electrical source-control-gate voltage with a source-control-gate voltage value is applied to the source-end control gate. An electrical drain-control-gate voltage with a drain-control-gate voltage value is applied to the drain-end control gate.

Here, the source-control-gate voltage value and the drain-control-gate voltage value are each greater in terms of absolute value than the injection gate voltage value.

The source-control-gate voltage value and the drain-control-gate voltage value may be the same here.

In order to program the drain-end storage element, a suitable electrical voltage is applied between the source region and the drain region. By means of the source-end control gate, electrical charge carriers from the source region are charged into the source-end edge section of the channel region under the source-end control gate. For this purpose, an electrical voltage which is comparatively high in terms of absolute value is applied to the source-end control gate, in which case a tunnel process of charge carriers into the source-end storage element does not yet occur. An electrical voltage which is comparatively low in terms of absolute value is applied to the injection gate. As a result, only a small number of electrical charge carriers pass into the central section of the channel region so that a very low electrical current flows there. An electrical voltage is applied to the drain-end control gate, said electrical voltage being sufficiently high to charge electrical charge carriers into the drain-end storage element. Consequently, a small amount of power is consumed in accordance with the low electrical current in the central channel region (power=current*voltage).

In the memory cell, owing to the source-end control gate, the electrical current in the central channel region can be selected to be particularly low without the flow of the electrical current in the channel region between the source region and the drain region being interrupted. The memory cell can thus be programmed in a way which is particularly economical in terms of current.

In order to program the source-end storage element, a suitable electrical source drain voltage is applied between the source region and the drain region, said source-drain voltage having reversed polarity in comparison to the source drain voltage for programming the drain-end storage element, while it can be of equal magnitude in terms of absolute value. If the source drain voltage is of equal magnitude in terms of absolute value, the other voltages can be selected to be equal to those programming the drain-end storage element.

When the source-end storage element is programmed, the power consumption by the injection gate is particularly low.

The storage element can have silicon nitride.

Alternatively, or in addition, the storage element can have silicon dioxide or another suitable insulator material.

The storage element may be an integrated part of an ONO layer which is formed from a first silicon dioxide layer, a silicon nitride layer which is formed on the first silicon dioxide layer, and a second silicon dioxide layer which is formed on the silicon nitride layer.

The gate oxide layer and the first silicon dioxide layer can be formed as separate layers. Alternatively, the gate oxide layer can be formed in one piece with the first silicon dioxide layer.

Contact can be made with the source-end control gate and the drain-end control gate separately. This is advantageous if different electrical voltages are to be applied to the source-end control gate and the drain-end control gate.

The source-end control gate and the drain-end control gate are preferably electrically connected to one another. In this case, in total only one voltage source is necessary for the source-end control gate and the drain-end control gate to apply a respective voltage. In addition, in this way, a particularly simple and thus efficient programming of the memory cell can be achieved. For example, the drain-end storage element can be programmed first, then the polarity of the source drain voltage can be reversed and then the source-end storage element can be programmed without further changes, as has already been explained above. Alternatively, the source-end storage element can be programmed first, and then the drain-end storage element.

The channel region can have an n-type channel. Alternatively, the channel region can have a p-type channel.

A memory array according to the invention, which is embodied as an EEPROM, has at least one memory cell which is constructed as described above.

BRIEF DESCRIPTION OF THE DRAWINGS

The exemplary embodiments of the invention are illustrated in the figures and will be explained in more detail below; of said figures.

DETAILED DESCRIPTION OF THE PREFERRED MODE OF THE INVENTION

Figure 1:
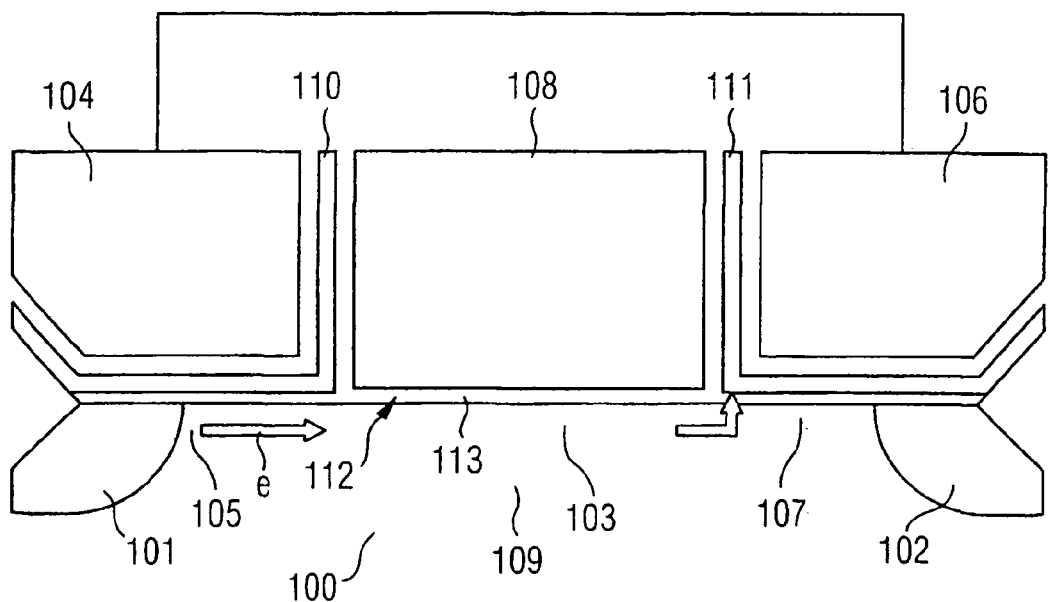
FIG. 1 shows a memory cell according to a first embodiment of the invention in which the drain-end storage element is programmed.

FIG. 1 shows a memory cell according to a first embodiment of the invention in which the drain-end storage element is programmed.

The memory cell from FIG. 1 has a substrate 100, an $n^+$-type doped source region 101 formed in the substrate 100, an $n^+$-doped drain region 102 formed in the substrate 100, and an n-type channel region 103 which runs between the source region 101 and the drain region 102 and has a variable electrical conductivity.

The memory cell also has a source-end control gate 104 which extends at least partially over a source-end edge section 105, adjoining the source region 101, of the channel region 103, and is designed to change the electrical conductivity of the source-end edge section 105.

The memory cell also has a drain-end control gate 106 which extends at least partially over a drain-end edge section 107, adjoining the drain region 102, of the channel region 103 and is designed to change the electrical conductivity of the drain-end edge section 107.

An injection gate 108 which extends over a central section 109 of the channel region 103 and is designed to change the electrical conductivity of the central section 109 is arranged between the source-end control gate 104 and the drain-end control gate 106. The central section 109 extends here between the source-end edge section 105 and the drain-end edge section 107 of the channel region 103.

The memory cell also has a source-end storage element 110 made of silicon nitride which extends between the source-end control gate 104 on the one hand, and the injection gate 108, the source-end edge section 105 and the source region 101 on the other.

In addition, the memory cell has a drain-end storage element 111 made of silicon nitride which extends between the drain-end control gate 106 on the one hand, and the injection gate 108, the drain-end edge section 107 and the drain region 102 on the other.

The memory cell also has a gate oxide arrangement 112 made of silicon dioxide. The gate oxide arrangement 112 has a gate oxide layer 113 which extends between the substrate 100 on the one hand, and the source-end control gate 104, the drain-end control gate 106 and the injection gate 108 on the other. A layer made of silicon dioxide is provided between the source-end control gate 104 and the source-end storage element 110, between the source-end storage element 110 and the injection gate 108, between the injection gate 108 and the drain-end storage element 111 and between the drain-end storage element 111 and the drain-end control gate 106, respectively, these layers made of silicon dioxide forming a part of the gate oxide arrangement 112 and being formed in one piece with the gate oxide layer 113.

The process of the programming of the drain-end storage element 106 is described below.

An electrical voltage of 0 V is applied to the source region 101. An electrical voltage of 5 V is applied to the drain region. An electrical voltage of 10 V is applied to the source-end control gate 104 and to the drain-end control gate 106 by means of a common voltage source. An electrical voltage of 1.5 V is applied to the injection gate 108. As a result, electrical charge carriers (electrons) are injected from the source region 101 into the source-end edge section 105 of the channel region 103. Owing to the relatively low voltage at the injection gate 108, only a low current flows in the central section 109 of the channel region 103. Owing to the high voltage at the drain-end control gate 106, electrical charge carriers (electrons) are charged into the drain-end storage element 111 and trapped there.

A memory cell according to an alternative embodiment of the invention has a $p^+$-type doped source region, a $p^+$-type doped drain region and a p-type channel region which runs between the source region and the drain region and has a variable electrical conductivity.

Figure 2:
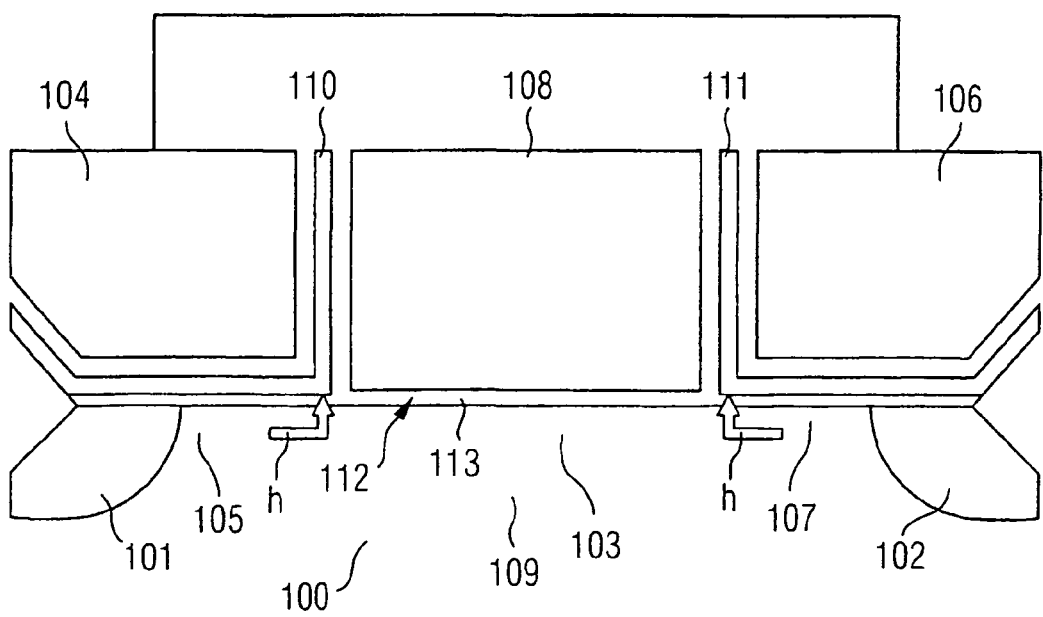
FIG. 2 shows the memory cell from FIG. 1 in which the memory contents of the source-end storage element and of the drain-end storage element are erased.

FIG. 2 shows the memory cell from FIG. 1 in which the memory contents of the source-end storage element 110 and of the drain-end storage element 111 are deleted.

The same positive electrical voltage of 5 V is applied to the source region 101 and to the drain region 102. The same negative electrical voltage of –5 V is applied to the source-end control gate 104 and to the drain-end control gate 106. An electrical voltage of 0 V is applied to the injection gate 108. As a result, holes are charged from the channel region 103 into the source-end storage element 110. These holes recombine with negative electrical charge carriers trapped in the source-end storage element 110. As a result, the negative electrical charge of the negative charge carriers which are trapped in the source-end storage element 110 are compensated, thus causing the memory contents in the source-end storage element 10 to be erased. In an analogous way, holes from the channel region 103 are charged into the drain-end storage element 111. As a result, the negative electrical charge of the electrical charge carriers trapped in the drain-end storage element 111 are compensated, thus causing the memory contents in the drain-end storage element 111 to be erased. In order to promote the discharging of the storage elements 110, 111, a negative electrical voltage can alternatively be applied to the injection gate 108.

In order to read out the memory contents (bits) stored in the source-end storage element 110, an electrical voltage of 1.2 V can be applied between the source region 101 (0 V) and the drain region 102 (1.2 V). A voltage of approximately 2 V is then applied to the source-end control gate 104, to the drain-end control gate 106 and to the injection gate 108, respectively. In order to read out the memory contents (bits) stored in the drain-end storage element 111, an electrical voltage of −1.2 V is applied between the source region 101 (1.2 V) and the drain region 102 (0 V). The voltages at the source-end control gate 104, at the drain-end control gate 106 and at the injection gate 108 are also 2 V, i.e., only the polarity of the source drain voltage is reversed.

The following table 1 shows typical electrical voltages which are to be applied to the different elements of the memory cell and which are suitable, in the combination given, for programming, erasing or reading out the memory cell.

TABLE 1

|  | Prog. Drain 111 | Prog. Source 110 | Erase | Read Source 110 | Read Drain 111 |
|---|---|---|---|---|---|
| Drain 102 | +5 V | 0 V | +5 V | +1.2 V | 0 V |
| Control gate 104, 106 | +10 V | +10 V | −5 V | +2 V | +2 V |
| Injection gate 108 | +1.5 V | +1.5 V | 0 V | +2 V | +2 V |
| Source 101 | 0 V | +5 V | +5 V | 0 V | +1.2 V |

A method for manufacturing a memory cell according to the invention will be described below with reference to FIGS. 3a to 3f.

Figure 3A:
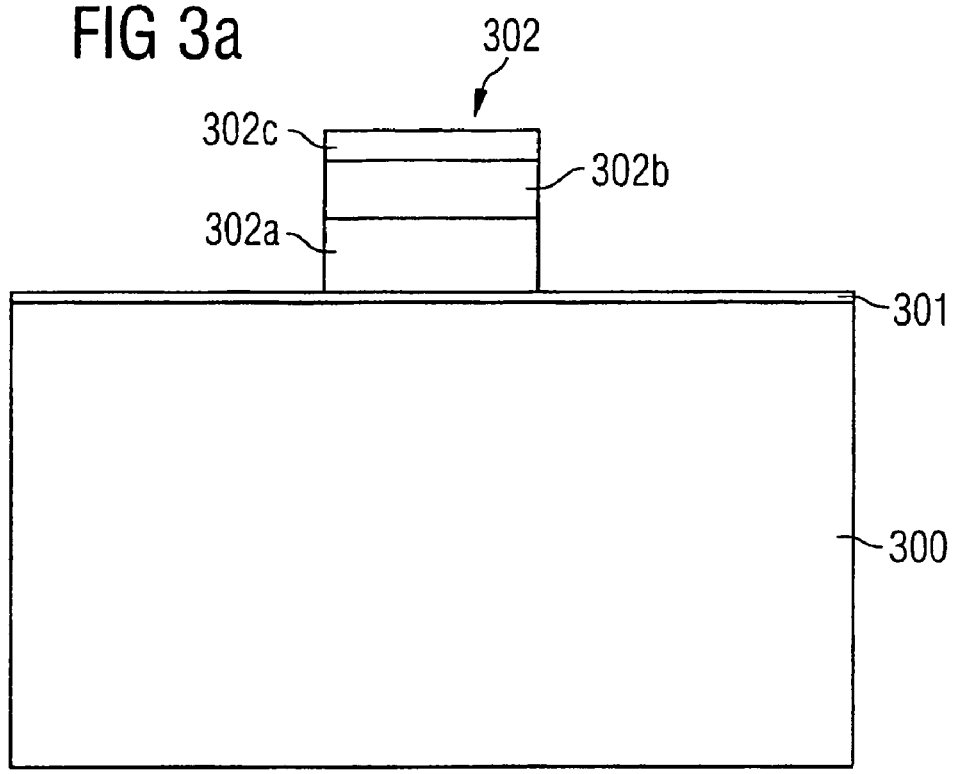
FIG. 3a shows a memory cell according to a second embodiment of the invention in cross section in a first fabrication state during its manufacture.

FIG. 3a shows a memory cell according to a second embodiment of the invention in cross section in a first fabrication state during its manufacture.

A p-type substrate 300 is used as the starting material for the memory cell. A 10 nm-thick gate oxide layer 301 is formed on the substrate 300. An injection gate layer with a layer sequence of, successively, polysilicon 302a, tungsten silicide 302b, TEOS (Tetra-Ethyl-Ortho-Silicate) 302c is formed on the gate oxide layer 301. The injection gate layer is patterned photolithographically (photolithography and subsequent etching of the injection gate layer), and the photolithographic resist is then stripped (removed) so that the injection gate 302 is formed, and the structure shown in FIG. 3a is thus formed.

Figure 3B:
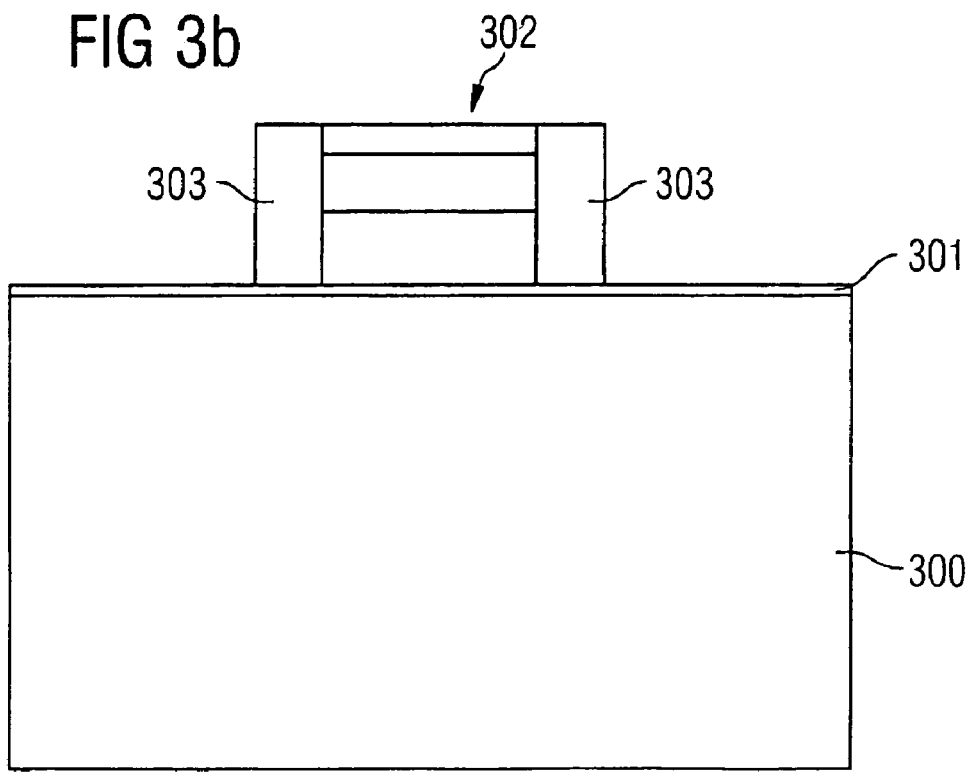
FIG. 3b shows the memory cell according to the second embodiment of the invention in cross section in a second fabrication state during its manufacture.

Then, as shown in FIG. 3b, a silicon nitride layer is deposited on the structure from FIG. 3a.

The silicon nitride layer is etched back so that nitride spacers 303 remain at the side of the injection gate 302, and the structure shown in FIG. 3b is formed.

Figure 3C:
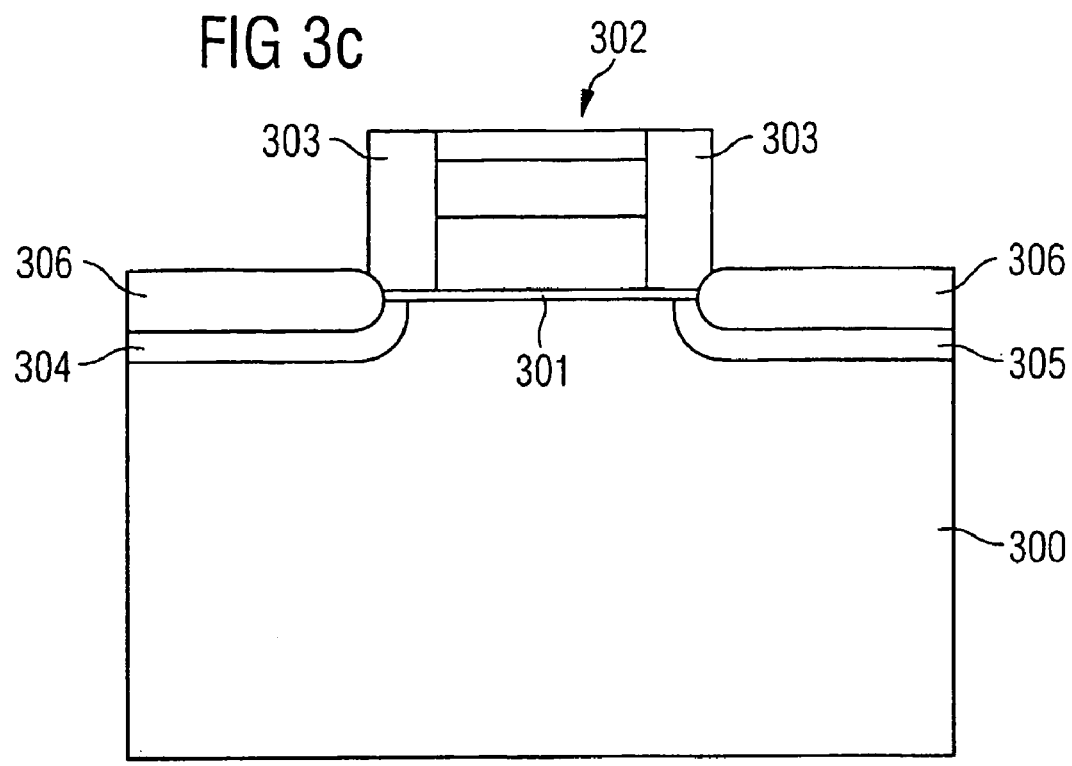
FIG. 3c shows the memory cell according to the second embodiment of the invention in cross section in a third fabrication state during its manufacture.

An arsenic implantation step during which a source region 304 and a drain region 305 are formed, as shown in FIG. 3c, is carried out on the structure from FIG. 3b. A channel region extends between the source region 304 and the drain region 305. In each case a layer made of thick oxide 306 is then formed over the source region 304 and the drain region 305 by means of oxidation so that the structure shown in FIG. 3c is formed.

The nitride spacers 303 are then removed by means of a wet etching step. In this wet etching step, a silicon dioxide layer acts as an etch stop layer so that the gate oxide layer 301 is not attacked and the structure shown in FIG. 3d is formed.

Figure 3D:
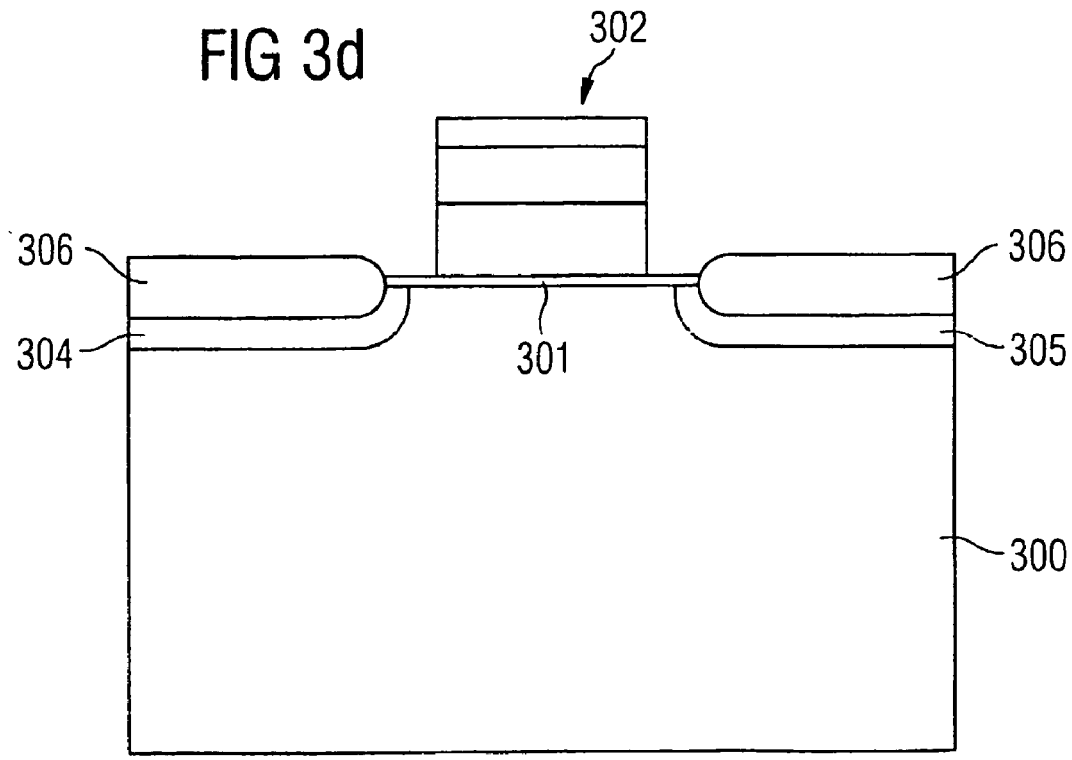
FIG. 3d shows the memory cell according to the second embodiment of the invention in cross section in a fourth fabrication state during its manufacture.
Figure 3E:
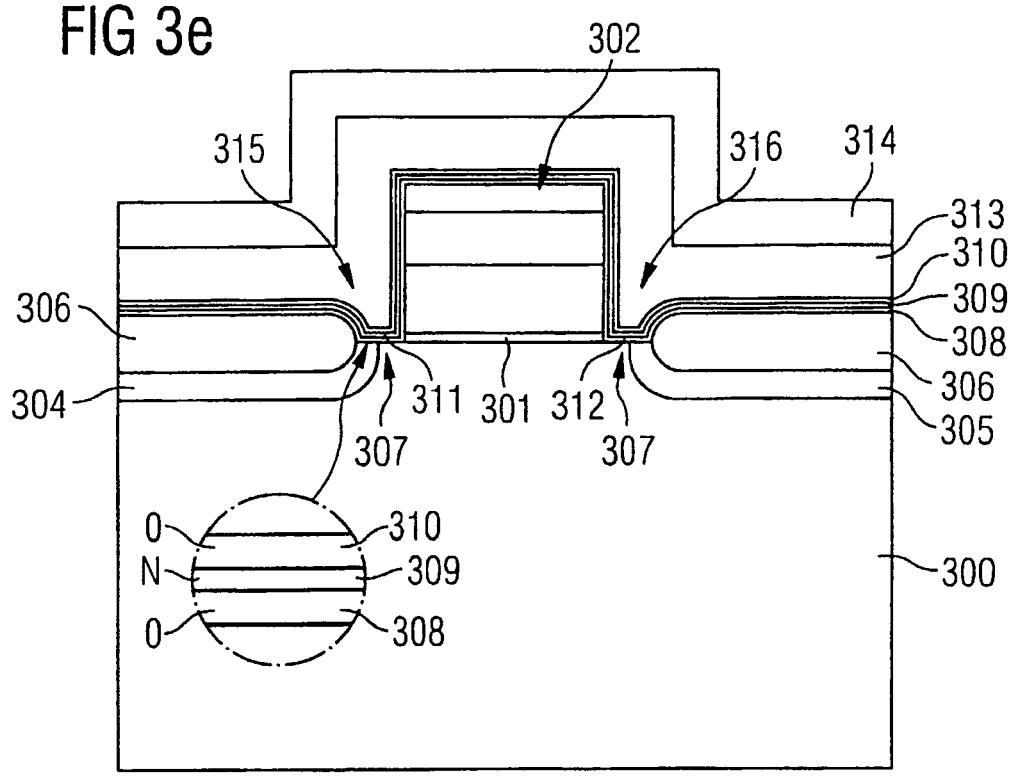
FIG. 3e shows the memory cell according to the second embodiment of the invention in cross section in the completed fabrication state.

As shown in FIG. 3e, starting from the structure from FIG. 3d, a silicon dioxide etching step, in which the gate oxide layer 301 is removed in regions 307 next to the injection gate 302 (and the thick oxide 306 thinned out), is firstly carried out. Then, a lower oxide layer 308 made of silicon dioxide is formed on the surface of the partially fabricated structure. A storage element layer 309 made of silicon nitride is formed on the lower oxide layer 308. An upper oxide layer 310 made of silicon dioxide is formed on the storage element layer 309. The lower oxide layer 308, the storage element layer 309 and the upper oxide layer 310 form an ONO layer (ONO=Oxide-Nitride-Oxide) in each of the regions 307 next to the injection gate 302 so that a source-end storage element 311 and a drain-end storage element 312 are formed. The source-end storage element 311 and the drain-end storage element 312 are each formed from the storage element layer 309 made of silicon nitride, and are bounded on the one side by the lower oxide layer 308 and on the other side by the upper oxide layer 310.

A polysilicon layer 313, which is doped in situ, is formed on the upper oxide layer 310. A tungsten silicide layer 314 is formed on the polysilicon layer 313. The polysilicon layer 313 and the tungsten silicide layer 314 are patterned photolithographically (photolithography and subsequent etching of the layers 313, 314), and the photolithographic resist is subsequently stripped (removed). In this way, a source-end control gate 315 and a drain-end control gate 316 are formed from the polysilicon layer 313 and the tungsten layer 314. The source-end control gate 315 and the drain-end control gate 316 are electrically connected to one another.

FIG. 3e shows the finished memory cell in cross section.

Figure 3F:
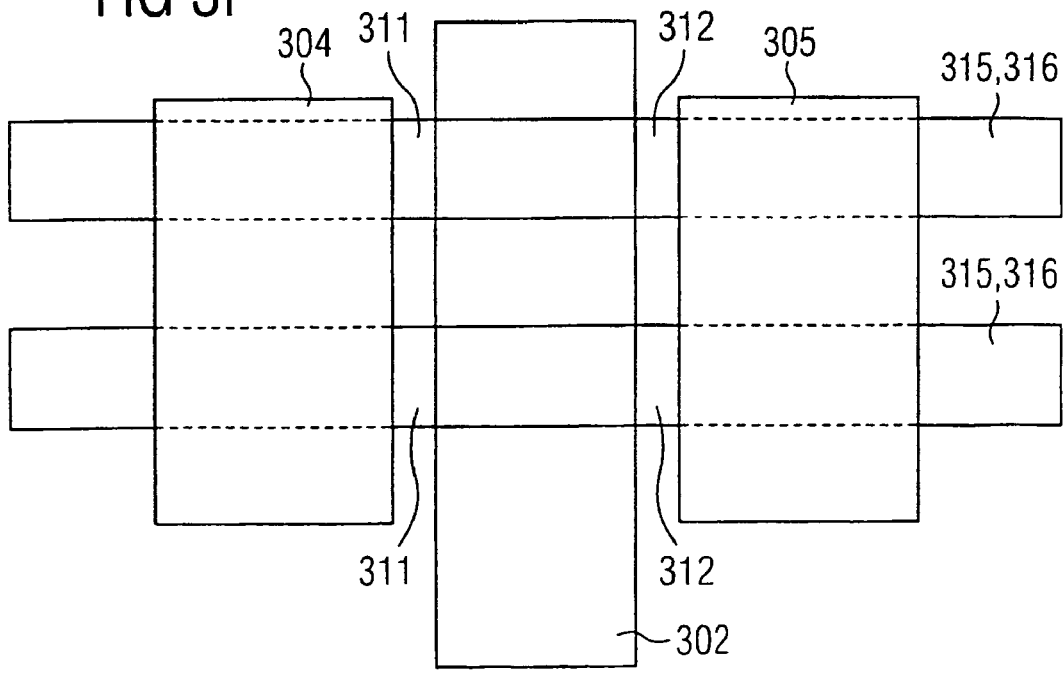
FIG. 3f shows two memory cells according to the invention, the same as that shown in FIG. 3e, from above.

FIG. 3f shows, for the sake of further clarification, two memory cells according to the invention which are arranged one next to the other and are the same as that shown in FIG. 3e, from above.

In alternative embodiments of the memory cell according to the invention, the substrate 100, 300 is an n-type substrate. In this case, the channel region has a p-type channel.

What is claimed is:

1. A memory cell comprising:
   a substrate;
   a source region formed in the substrate;
   a drain region formed in the substrate;
   a channel region provided between the source region and the drain region and having a variable electrical conductivity;
   a source-end control gate extending at least partially over a source-end edge section, which adjoins the source region, and being designed to change the electrical conductivity of the source-end edge section;
   a drain-end control gate extending at least partially over a drain-end edge section, which adjoins the drain region, and being designed to change the electrical conductivity of the drain-end edge section;
   an injection gate arranged between the source-end control gate and the drain-end control gate and extending over a central section of the channel region, the injection gate being electrically isolated from the drain-end control gate and designed to change the electrical conductivity of the central section, which extends between the source-end edge section and the drain-end edge section of the channel region;

a source-end storage element extending at least between the source-end edge section and the source-end control gate;

a drain-end storage element extending at least between the drain-end edge section and the drain-end control gate; and a gate oxide arrangement having at least one gate oxide layer extending between the substrate on the one side and the source-end control gate, the drain-end control gate and the injection gate on the other side, wherein the source-end control gate and the drain-end control gate are electrically connected to one another.

2. The memory cell according to claim 1, wherein the storage element includes silicon nitride.

3. The memory cell according to claim 1, wherein the storage element includes silicon dioxide.

4. The memory cell according to claim 1, wherein at least one of the source-end storage element and the drain-end storage element is an integrated part of an ONO layer, which is formed from a first silicon dioxide layer, a silicon nitride layer formed on the first silicon dioxide layer, and a second silicon dioxide layer formed on the silicon nitride layer.

5. The memory cell according to claim 4, wherein the gate oxide layer is formed of single-piece construction with the first silicon dioxide layer.

6. The memory cell according to claim 1, wherein the channel region has an n-type channel.

7. The memory cell according to claim 1, wherein the channel region has a p-type channel.

8. A method for programming a memory cell as defined in claim 1, wherein an electrical source voltage with a source voltage value is applied to the source region, and an electrical drain voltage with a drain voltage value is applied to the drain region, the source voltage value and the drain voltage value being different, comprising the steps of:

applying an electrical injection gate voltage with an injection gate voltage value to the injection gate;

applying an electrical source-control-gate voltage with a source-control-gate voltage value to the source-end control gate; and applying an electrical drain-control-gate voltage with a drain-control-gate voltage value to the drain-end control gate;

wherein the drain-control-gate voltage value and the source-control-gate-voltage value are the same and the source-control-gate voltage value and the drain-control-gate voltage value each have a greater absolute value than the injection gate voltage value.

9. A method for erasing a memory cell as defined in claim 1, wherein an electrical source voltage with a source voltage value is applied to the source region, and an electrical drain voltage with a drain voltage value is applied to the drain region, the source voltage value and the drain voltage value being different, comprising the steps of:

applying an electrical injection gate voltage with an injection gate voltage value to the injection gate;

applying an electrical source-control-gate voltage with a source-control-gate voltage value to the source-end control gate; and applying an electrical drain-control-gate voltage with a drain-control-gate voltage value to the drain-end control gate;

wherein the drain-control-gate voltage value and the source-control-gate-voltage value are the same and the source-control-gate voltage value and the drain-control-gate voltage value each have a greater absolute value than the injection gate voltage value.

10. A method for programming a memory cell as defined in claim 1, comprising the steps of:

applying a first electrical voltage to the injection gate; and applying a second electrical voltage to each of the source-end control gate and the drain-end control gate, wherein the second electrical voltage has a greater absolute value that the first electrical voltage.

* * * * *